United States Patent
Giusti et al.

(10) Patent No.: US 12,185,633 B2
(45) Date of Patent: Dec. 31, 2024

(54) PIEZOELECTRIC MEMS DEVICE WITH A SUSPENDED MEMBRANE HAVING HIGH MECHANICAL SHOCK RESISTANCE AND MANUFACTURING PROCESS THEREOF

(71) Applicant: STMICROELECTRONICS S.r.l., Agrate Brianza (IT)

(72) Inventors: Domenico Giusti, Caponago (IT); Carlo Luigi Prelini, Seveso (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/329,975

(22) Filed: Jun. 6, 2023

(65) Prior Publication Data

US 2023/0320222 A1  Oct. 5, 2023

Related U.S. Application Data

(62) Division of application No. 16/706,567, filed on Dec. 6, 2019, now Pat. No. 11,696,507.

(30) Foreign Application Priority Data

Dec. 14, 2018 (IT) .......................... 102018000011115

(51) Int. Cl.
 *H10N 30/20* (2023.01)
 *B81B 3/00* (2006.01)
(52) U.S. Cl.
 CPC ....... *H10N 30/2042* (2023.02); *B81B 3/0018* (2013.01); *B81B 3/0072* (2013.01); *B81B 2201/032* (2013.01)

(58) Field of Classification Search
 None
 See application file for complete search history.

(56) References Cited

U.S. PATENT DOCUMENTS

| | | | |
|---|---|---|---|
| 7,625,073 B2 | 12/2009 | Kitakami et al. | |
| 8,258,678 B2 * | 9/2012 | Buccafusca | G01N 29/27 310/334 |
| 8,736,145 B2 | 5/2014 | Liu et al. | |
| 10,060,818 B2 * | 8/2018 | Yuzawa | G01L 9/008 |
| 2009/0026892 A1 * | 1/2009 | Nakamura | H10N 30/2042 29/25.35 |

(Continued)

FOREIGN PATENT DOCUMENTS

| | | |
|---|---|---|
| JP | H11309867 A | 11/1999 |
| JP | 2002059555 A | 2/2002 |

OTHER PUBLICATIONS

Polight, "Potential Optimization of TLens® Integration for Selected Use Cases," Application Note, DOC-01, Feb. 4, 2019.

*Primary Examiner* — Nishath Yasmeen
(74) *Attorney, Agent, or Firm* — Seed IP Law Group LLP

(57) ABSTRACT

A MEMS device having a body with a first and a second surface, a first portion and a second portion. The MEMS device further has a cavity extending in the body from the second surface; a deformable portion between the first surface and the cavity; and a piezoelectric actuator arranged on the first surface, on the deformable portion. The deformable portion has a first region with a first thickness and a second region with a second thickness greater than the first thickness. The second region is adjacent to the first region and to the first portion of the body.

20 Claims, 13 Drawing Sheets

(56) References Cited

U.S. PATENT DOCUMENTS

| | | | |
|---|---|---|---|
| 2010/0308794 A1* | 12/2010 | Townsend | G01M 5/0091 |
| | | | 324/103 P |
| 2012/0266686 A1 | 10/2012 | Huffman | |
| 2014/0191616 A1* | 7/2014 | Toyoda | H10N 30/2042 |
| | | | 310/333 |
| 2017/0059424 A1* | 3/2017 | Yuzawa | G01L 1/2206 |
| 2017/0186940 A1* | 6/2017 | Bevilacqua | H10N 30/88 |
| 2018/0190895 A1 | 7/2018 | Giusti et al. | |
| 2019/0023014 A1 | 1/2019 | Giusti et al. | |
| 2019/0039880 A1* | 2/2019 | Paci | B81B 3/0021 |
| 2019/0240844 A1 | 8/2019 | Giusti et al. | |

* cited by examiner

PIEZOELECTRIC MEMS DEVICE WITH A SUSPENDED MEMBRANE HAVING HIGH MECHANICAL SHOCK RESISTANCE AND MANUFACTURING PROCESS THEREOF

BACKGROUND

Technical Field

The present disclosure relates to a piezoelectric MEMS (MicroElectroMechanical System) device with a suspended membrane having high mechanical shock resistance and to the manufacturing process thereof.

Description of the Related Art

As known, actuators are devices that convert a physical quantity of one type into another physical quantity of a different type; in particular, the quantity deriving from the conversion usually involves some form of movement or mechanical action.

Recently, actuators of micrometric and nanometric dimensions have been proposed, also referred to as micro-actuators or nano-actuators, which can be manufactured using the semiconductor technology (the so-called MEMS technology) and thus at very contained costs. Such micro-actuators and nano-actuators can be used in a wide range of devices, in particular in mobile and portable devices.

Examples of micro-actuators are valves, switches, pumps, linear and rotary micromotors, linear-positioning devices, speakers, optical devices, and piezoelectric micro-machined ultrasonic transducers (PMUTs).

Micro-actuators of a known type may operate according to four physical principles:
- Electrostatic: they exploit the attraction between conductors charged in an opposite way;
- Thermal: they exploit the displacement caused by thermal expansion or contraction;
- Piezoelectric: they exploit the displacement caused by the strain and stress induced by electrical fields; and
- Magnetic: they exploit the displacement caused by the interaction between different elements having magnetic characteristics, such as permanent magnets, external magnetic fields, magnetisable materials and conductors of electric current.

Each technology presents advantages and limits as regards power consumption, rapidity of movement, exerted force, movement amplitude, movement profile, simplicity of manufacture, amplitude of the applied electrical signals, strength, and sensitivity, which render advantageous use thereof in certain applications, but not in others and thus determine the sector of use.

Hereinafter, reference is made to a MEMS actuator device that operates according to a piezoelectric principle and in particular is able to exploit the TFP (Thin-Film Piezo) MEMS technology.

TFP MEMS technology currently uses a unimorphic actuation mode, in which a structure (for example, a membrane, a beam, or a cantilever), generally formed by at least two layers arranged on top of one another, undergoes bending as a result of variations in the applied load. In this case, there is a controlled alteration of the strain in one of the layers, referred to as "active" layer, which causes an induced strain in the other layer or layers, also referred to as "inactive" or "passive" layer or layers, with consequent flexure of the structure.

This technique is advantageously used for bending the membrane, beam, or cantilever in applications where a vertical movement, i.e., a movement in the direction perpendicular to the lying plane of the structure is desired, such as in liquid ink-jet printing heads, autofocus systems, micropumps, microswitches, speakers, and PMUTs.

For instance, FIGS. 1A and 1B illustrate a cantilever 1, fixed at a first end 2 and free to bend at a second end 3. The cantilever 1 is formed herein by a stack of layers, including a carrier layer 5, for example, of semiconductor having a first conductivity type, for example, P; an active layer 6, for example, of piezoelectric material (PZT), forming a piezoelectric layer; and a top layer 7, for example, of semiconductor having a second conductivity type, for example, N.

In the presence of a reverse bias, as illustrated in FIG. 1B, the applied electrical field causes strains in the cantilever 1, which generates a downward deflection of the free end 3.

An embodiment of a MEMS piezoelectric actuator applied to a generic optical device is illustrated in FIGS. 2A and 2B. Here, the optical device, designated by 10, comprises a deformable part or membrane 15, for example, of glass (e.g., BPSG, BoroPhosphoSilicate Glass), which rests, via a lens element 11 (e.g., polymeric material), on a support 12, which is, for example, also of glass; the membrane 15 moreover carries two piezoelectric regions 13, arranged at a distance from one another.

In the absence of bias, FIG. 2A, the membrane 15 and the lens element 11 have a planar surface and do not modify the path of a light beam 16 that crosses them. When the piezoelectric regions 13 are biased (FIG. 2B), they cause a deformation of the membrane 15. The deformation of the central region of the membrane 15 is transmitted to the lens element 11, the top surface whereof curves, modifying the focus of the lens element 11 and thus the path of the light beam 16. It is thus possible to modify the characteristics of optical transmission of the optical device 10.

The piezoelectric actuators illustrated in FIGS. 1A, 1B, 2A, and 2B have the advantage of being fast and compact devices; in fact, unlike other types of actuators, such as capacitive and/or magnetic actuators, they do not require additional structures, such as electrodes connected to a reference potential (as in the case of capacitive actuators) or magnets and/or coils (as in the case of magnetic actuators).

Another embodiment of a piezoelectric-actuation MEMS device is illustrated in FIG. 3 and is designated by 30 hereinafter. In particular, the MEMS device 30 has, for example, a quadrangular (e.g., square) or circular shape in top plan view (not illustrated), with center O lying on a central axis S parallel to an axis Z of a Cartesian reference system XYZ.

The MEMS device 30 comprises a body 31, extending in thickness along the axis Z and having a first and a second surface 31A, 31B. In particular, the body 31 comprises a substrate 32, of semiconductor material (e.g., silicon), delimited at the top by a third surface 32A and at the bottom by the second surface 31B. The substrate 32 accommodates a cavity 34, extending from the second surface 31B throughout the entire thickness (along the axis Z) of the substrate 32.

In detail, the cavity 34 is delimited at the side by a wall 34A and at the top by a bottom surface 34B; moreover, the cavity 34 has, in top plan view, for example a circular shape with center O.

The body 31 further comprises an insulating layer 39, for example, of silicon oxide ($SiO_2$), extending over the third surface 32A of the substrate 32; and a structural layer 41, for example, of glass, such as BPSG, extending over the insulating layer 39. The insulating layer 39 and the structural layer 41 form a membrane 37, fixed to the substrate 32 at a peripheral portion 45 of the body 31.

A piezoelectric actuator 50, having, for example, an annular shape with center O in top plan view, extends on the first surface 31A of the body 31 along the entire periphery of the MEMS device 30. The internal circumference of the piezoelectric actuator 50 defines a central portion 43 of the body 31, where the structural layer 41 is at least partly exposed.

In particular, the piezoelectric actuator 50 is formed by a stack of layers, comprising a first electrode 60; a piezoelectric material layer 61, for example PZT (Pb, Zr, $TiO_2$) or aluminum nitride (AlN), extending on the first electrode 60; and a second electrode 62, extending on the piezoelectric material layer 61. In particular, the first and the second electrodes 60, 62 are electrically coupled to respective voltage generators (not illustrated) by respective conductive paths (not illustrated).

In use, a difference of potential is applied between the first and the second electrodes 60, 62 of the piezoelectric actuator 50 so as to generate a deflection of the membrane 37 in the upward direction (i.e., along the axis Z, towards the outside of the cavity 34) in a unidirectional way; in particular, the deflection of the membrane 37 generates a spherical curvature at the central portion 43 of the body 31.

The MEMS device 30 of FIG. 3 may be used, for example, in applications of an optical type according to the modalities illustrated in FIGS. 2A-2B. In this case, the spherical curvature of the membrane 37 generated by deflection of the latter enables the optical aperture of the MEMS device 30 to be adjusted and thus, the path of the light beams that cross it.

FIG. 4 shows another embodiment of a piezoelectrically actuated MEMS device that may be used, for example, in a radiofrequency (RF) switch.

In detail, FIG. 4 shows a switch 770 including the MEMS device 730 and a counter-contact element. The MEMS device 730 has a general structure similar to the MEMS device 30 of FIG. 3. Consequently, parts that are similar to the ones illustrated and described with reference to FIG. 3 are indicated in FIG. 4 by the same reference numbers increased by 700 and will not be described any further.

In particular, the MEMS device 730 has an opening 772, extending through the structural layer 741 and the insulating layer 739 (and, thus, the membrane 737) at the central portion 743 of the body 731. In detail, the opening 772 has, in top plan view, for example a circular shape with center O. The structural layer 741 of the MEMS device 730 may, for example, be of polysilicon or oxide (e.g., silicon oxide).

The MEMS device 730 further comprises a first electrical contact 774, which has, for example, an annular shape, in top plan view, with center O and surrounds the opening 772. The first electrical contact 770 is electrically coupled to a first terminal 776 by first electrical lines 775 (schematically illustrated in FIG. 4).

The switch 770 further comprises a contact element 777, facing the MEMS device 730. In particular, the contact element 777 comprises a contact substrate 780, having a contact surface 780A facing the MEMS device 730 and extending in a plane parallel to a plane XY of a Cartesian reference system XYZ; and a second electrical contact 785, arranged on the surface 780A. In detail, the second electrical contact 785 extends along an axis X of the Cartesian reference system XYZ so as to face and be aligned to the first electrical contact 774. The second electrical contact 785 is further electrically coupled by second electrical lines 786 (schematically illustrated in FIG. 4) to a second terminal 790. The terminals 776 and 790 may be coupled to appropriate nodes of an RF circuit (not illustrated).

In a rest condition, i.e., when the difference of potential between the first and the second electrodes 760, 762 of the piezoelectric actuator 750 is zero, the membrane 737 extends parallel to the plane XY and to the contact element 777 (i.e., it is not deflected); consequently, the terminals 776 and 790 are electrically separated and the switch 770 is open.

When a difference of potential of appropriate value is applied between the first and the second electrodes 760, 762, it causes deflection of the membrane 737 upwards and brings the first electrical contact 774 against the second electrical contact 785, electrically coupling the first and the second terminals 776, 790 together and closing the switch 770.

In an operating condition, the piezoelectrically actuated devices illustrated in FIGS. 3 and 4 may be subject to mechanical shocks, for example as a result of drops.

In this case, a mechanical shock generates a force of a high value on the membrane 37, 737 of the MEMS device 30, 730, generating a sharp deflection of the membrane 37, 737 itself. Application of a force of high value in a sudden way involves a sudden stress on the structure, in particular at the membrane 37, 737 where it is fixed to the peripheral portion 45, 745 of the MEMS device 30, 730. This stress, over time, may generate one or more fractures in the stressed region of the membrane 37, 737, thus jeopardizing correct operation of the MEMS device 30, 730.

To solve this problem, it is therefore desirable to increase the resistance to mechanical shock of the MEMS device 30, 730. For instance, it is possible to increase the thickness of the membrane 37, 737. However, an increase in the thickness of the membrane 37, 737 determines a corresponding degradation of the optical aperture of the MEMS device 30 of FIG. 3, or, in the case of the switch 770 of FIG. 4, a reduction of the deflection of the membrane 737, and this reduces the efficiency of the piezoelectric actuator 50, 750 during use. In fact, in this case, the piezoelectric actuator 50, 750 requires a higher actuation voltage to be able to deflect the membrane 37, 737 and thus to generate the spherical shaped curvature for adjusting, as desired, the optical aperture of the MEMS device 30, or, in the case of the switch 770, to cause the first and the second electrical contacts 774, 785 to come into contact with one another.

BRIEF SUMMARY

The aim of the present disclosure is to provide a piezoelectric MEMS device and a manufacturing process thereof that overcome the drawbacks of the prior art.

According to the present disclosure, a MEMS device and a manufacturing process thereof are provided, as defined in the attached claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 5 and 6 show a MEMS device 130 according to an embodiment. In particular, the MEMS device 130 has a quadrangular shape in top plan view (FIG. 6), with center O lying on a central axis S parallel to an axis Z of the Cartesian reference system XYZ.

With reference to FIG. 5, the MEMS device 130 comprises a body 131, extending in thickness in a thickness parallel to the axis Z and has a first and a second surface 131A, 131B. In particular, the body 131 comprises a substrate 132, of semiconductor material (e.g., silicon), delimited at the top by a third surface 132A and at the bottom by the second surface 131B. The substrate 132 has a cavity 134 extending throughout the entire thickness of the substrate 132; in particular, the cavity 134 is delimited at the side by a wall 134A. Moreover, the cavity 134 has, in top plan view (FIG. 6), a circular shape with center O and diameter $D_1$.

Figure 1A:
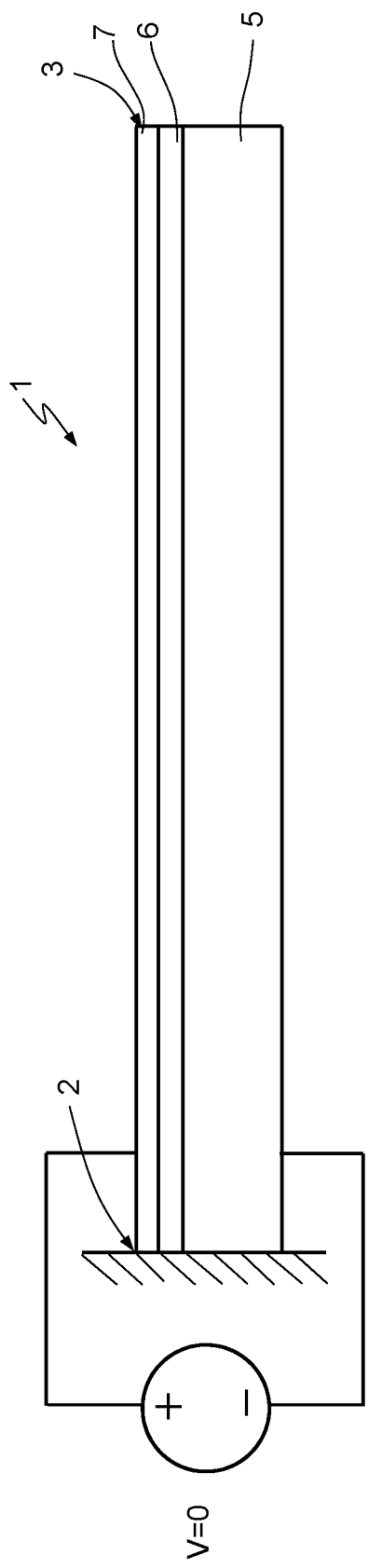
FIGS. 1A and 1B show simplified side views of a known MEMS piezoelectric actuator, in a rest condition and in a deformed condition, respectively.
Figure 1B:
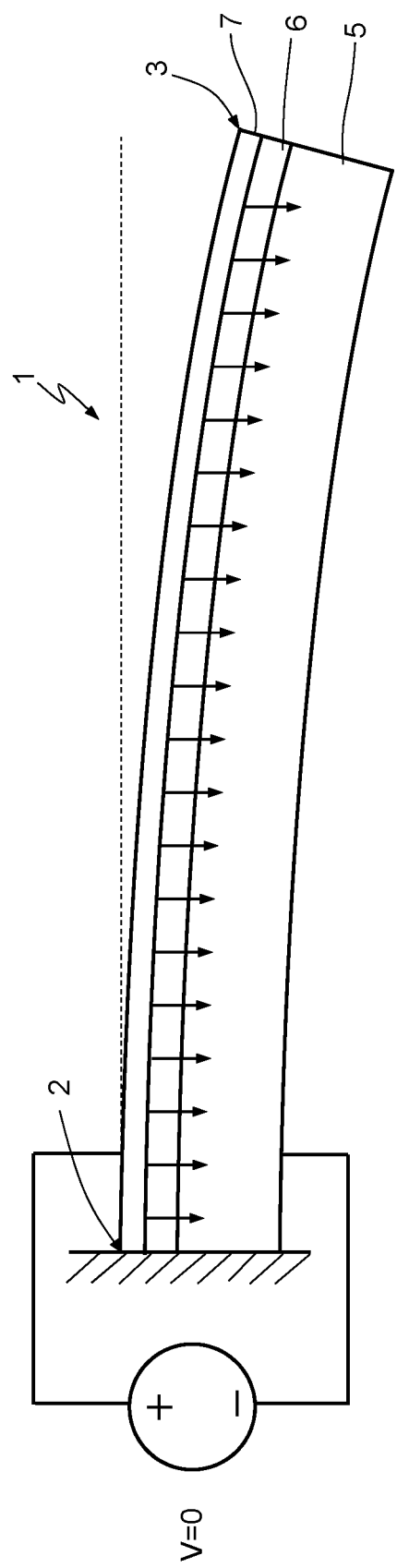
Figure 2A:
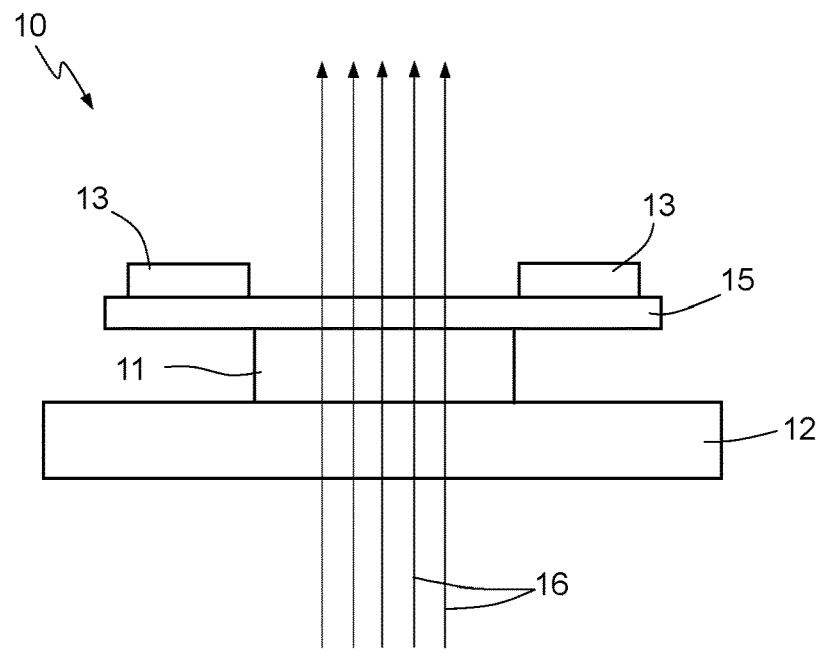
FIGS. 2A and 2B show simplified side views of another known MEMS piezoelectric actuator, used in an optical device, in a rest condition and in a deformed condition, respectively.
Figure 2B:
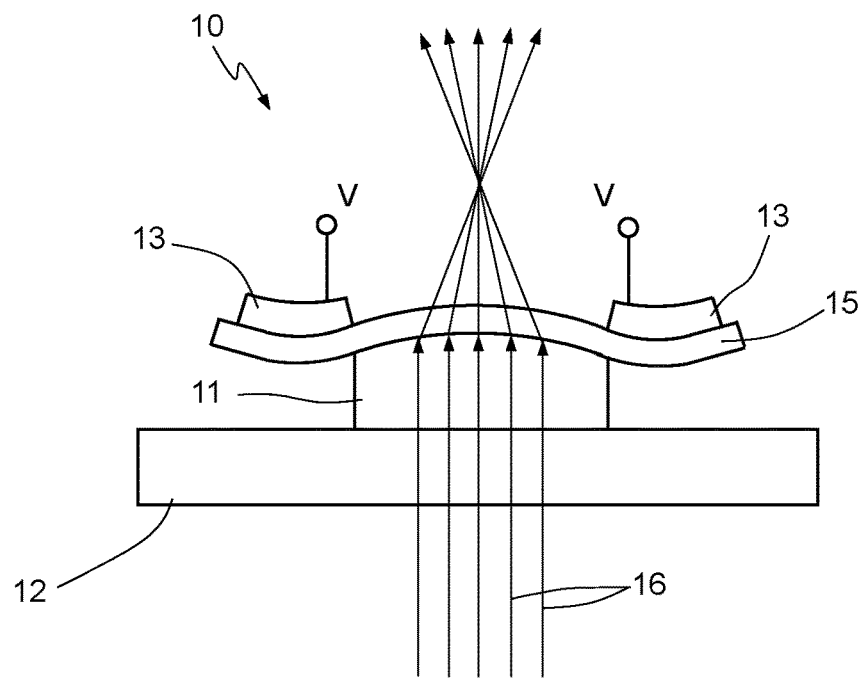

The body 131 further comprises a stiffening element 170 extending on the third surface 132A. In particular, the stiffening element 170 comprises a stiffening layer 171 of semiconductor (e.g., polysilicon), and a coating layer 172, of insulating material (e.g., silicon oxide).

The stiffening element 170 has at the center an opening 170A, which is concentric with respect to the cavity 134 and has a diameter $D_2$, smaller than the diameter $D_1$ of the cavity 134. Consequently (FIG. 5), the stiffening element 170 projects, with respect to the substrate 132, towards the inside of the cavity 134, to form a first part of end surface 170B of the cavity 134.

The coating layer 172 coats the stiffening layer 171 on the side facing the substrate 170 and fixes the stiffening element 170 to the substrate 132. Moreover, the coating layer 172 coats the inner wall of the opening 170A.

The stiffening element 170 has a thickness (stiffening thickness $T_1$), for example between 1 µm and 20 µm.

The body 131 further comprises an insulating layer 139, for example of silicon oxide, extending on the third surface 132A; and a structural layer 141, for example of BPSG, extending on the insulating layer 139. In particular, the structural layer 141 is delimited at the top by the first surface 131A of the body 131, and the ensemble formed by the insulating layer 139 and the structural layer 141 has a structural thickness $T_2$, for example comprised between 5 µm and 50 µm. Moreover, the portion of insulating layer 139 exposed by the opening 170A delimits the cavity 134 at the top, to form a second part of end surface 134A of the cavity 134.

The coating layer 172, the stiffening layer 171, the insulating layer 139 and the structural layer 141 form a membrane 137 of variable thickness, suspended over the cavity 134. In particular, the membrane 137 has a first and a second portion 180, 181. The first portion 180 is formed only by the insulating layer 139 and by the structural layer 141, is surrounded by the second portion 181 of the membrane 137, and has a thickness equal to the structural thickness $T_2$. The second portion 181 is formed by the insulating layer 139, the structural layer 141, the stiffening layer 171 and the coating layer 172, is arranged adjacent to a peripheral portion 145 of the body 131, and has a thickness $T_3$ equal to the sum of the stiffening thickness $T_1$ and the structural thickness $T_2$.

Figure 6:
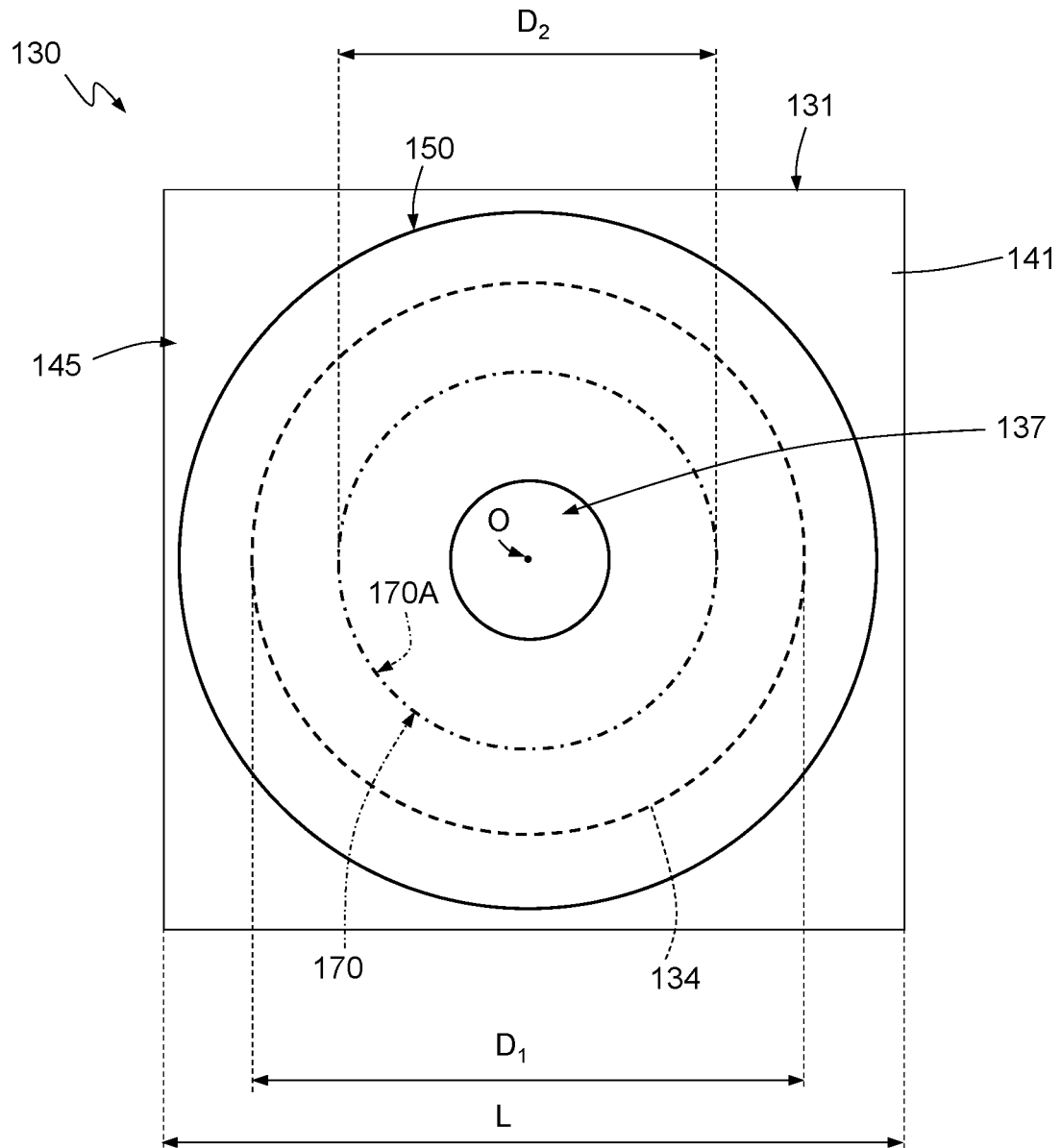
FIG. 6 shows the MEMS device of FIG. 5 in top plan view.
Figure 7:
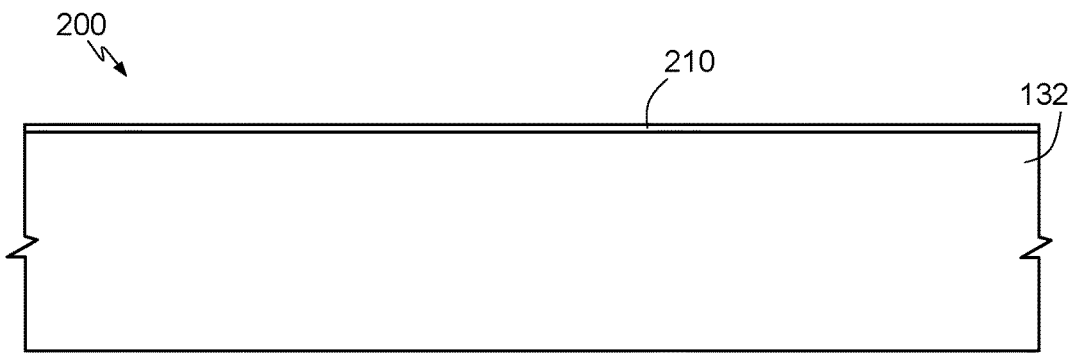
FIGS. 7-14 show successive steps of the manufacturing process of the MEMS device of FIGS. 5-6.

Moreover, as may be noted from the top plan view of FIG. 6, the membrane 137 has a circular shape with a diameter equal to the diameter $D_2$ of the opening 170A.

A piezoelectric actuator 150 having, in top plan view (FIG. 6), an annular shape with center O (and thus concentric with the cavity 134 and to the opening 170A) extends on the structural layer 141 and specifically on the first surface 131A of the body 131. In practice, in top plan view, the piezoelectric actuator 150 extends on the peripheral portion 145 of the body 131 and surrounds a central portion 143 of the body 131.

In particular, the piezoelectric actuator 150 is formed by a stack of layers, comprising a first electrode 160, of conductive material; a piezoelectric material layer 161, for example PZT (Pb, Zr, $TiO_2$), aluminum nitride (AlN), potassium-sodium niobate (KNN) or barium titanate ($BaTiO_3$), extending on the first electrode 160; and a second electrode 162, of conductive material, extending on the piezoelectric material layer 161. In particular, the first and the second electrodes 160, 162 are electrically coupled to respective voltage sources (not illustrated) by conductive paths (not illustrated).

Moreover, a dielectric layer (not illustrated) extends between the structural layer 141 and the first electrode 161 so as to physically and electrically isolate them from one another.

Figure 3:
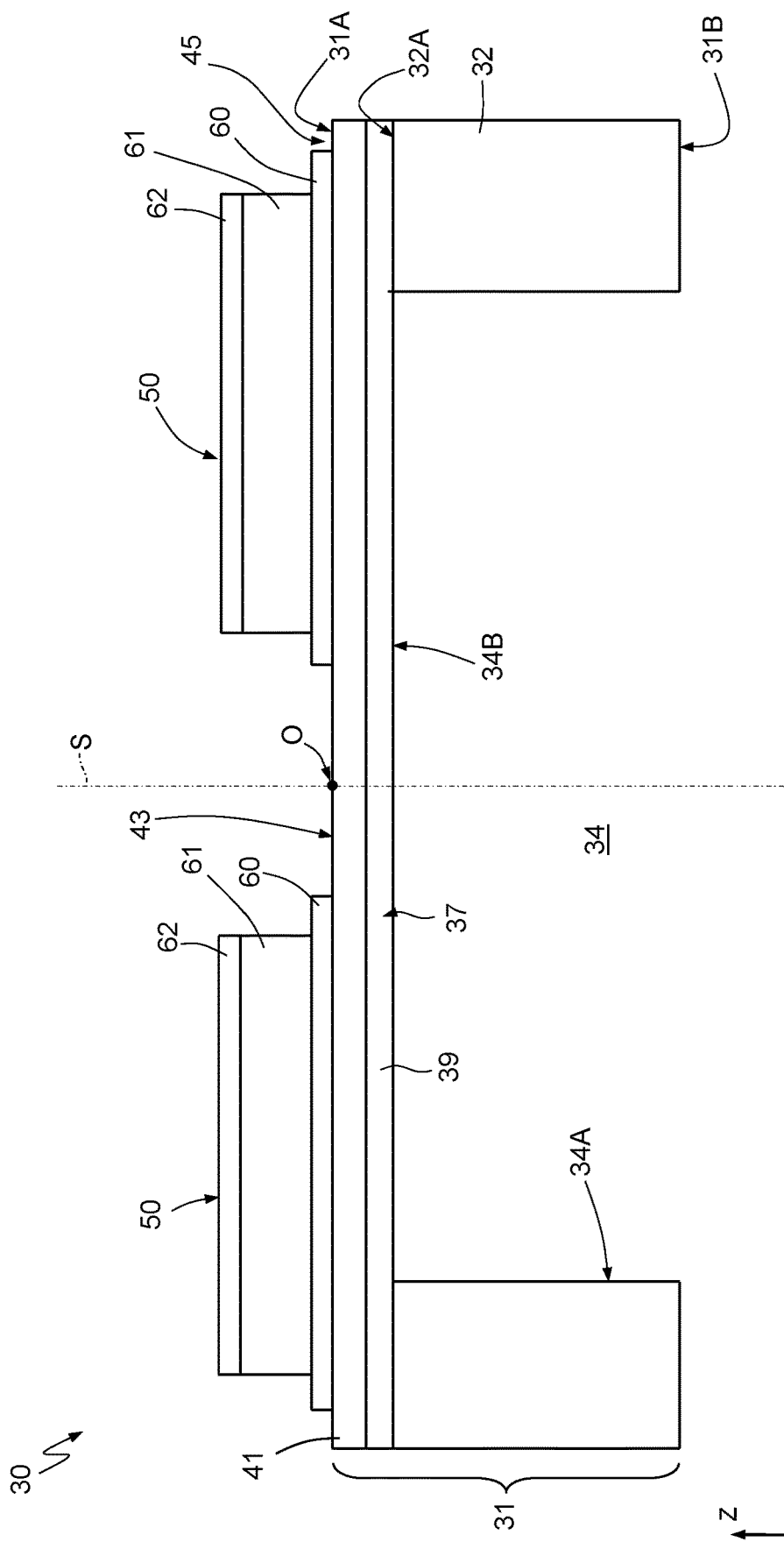
FIG. 3 shows a simplified cross-section of a known MEMS piezoelectric actuator.
Figure 5:
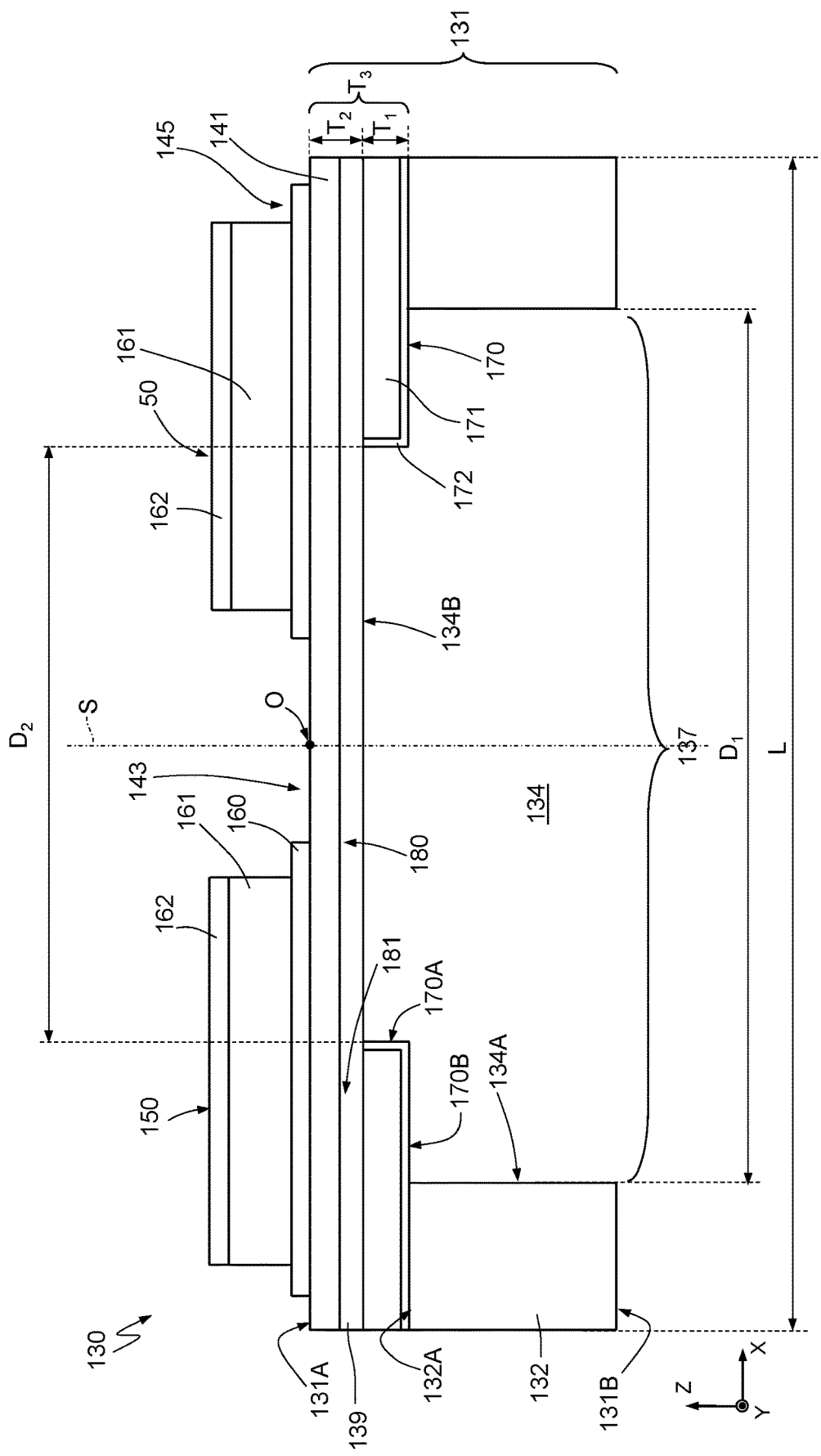
FIG. 5 shows a simplified cross-section of the present MEMS device according to one embodiment.

In use, the MEMS device 130 operates according to the modalities described with reference to the MEMS device 30 of FIG. 3; in particular, the MEMS device 130 of FIGS. 5-6 is advantageously used, for example, in optical applications.

The stiffening element 170 allows an increase in the resistance to mechanical shock of the membrane 137 of the MEMS device 130 in its peripheral portion (first portion 180) without increasing the thickness in the operative central region (second portion 181) of the membrane 137, and thus without reducing the performance of the MEMS device 130. In fact, the stiffening element 170 is of a material (here, polysilicon) capable of withstanding a high tensile stress (e.g., ranging between 1 GPa and 2 GPa). In this way, when a high force due to a mechanical shock (e.g., when the device is dropped) acts on the MEMS device 130, causing a high stress in the second portion 181 of the membrane 137, the stiffening element 170 is capable of absorbing said force (and, thus, the stress localized in the second portion 181) at least in part. In this way, it is possible to limit sharp deflection of the membrane 137 and prevent possible failures. In other words, the stiffening element 170 locally thickens the membrane 137 in the points of greater concentration of the mechanical stress.

The manufacturing steps of the MEMS device 130 are illustrated schematically in FIGS. 7-14.

Initially (FIG. 7), a protective layer 210, for example of silicon oxide, is thermally grown on a semiconductor wafer designed to form the substrate 132 of FIGS. 5-6, and thus designated by the same reference number, using known growth techniques. As a whole, the wafer thus formed is designated by the reference number 200. The wafer 200 has a bottom surface forming the second surface 131B of the body 131 of FIGS. 5-6.

Figure 8:
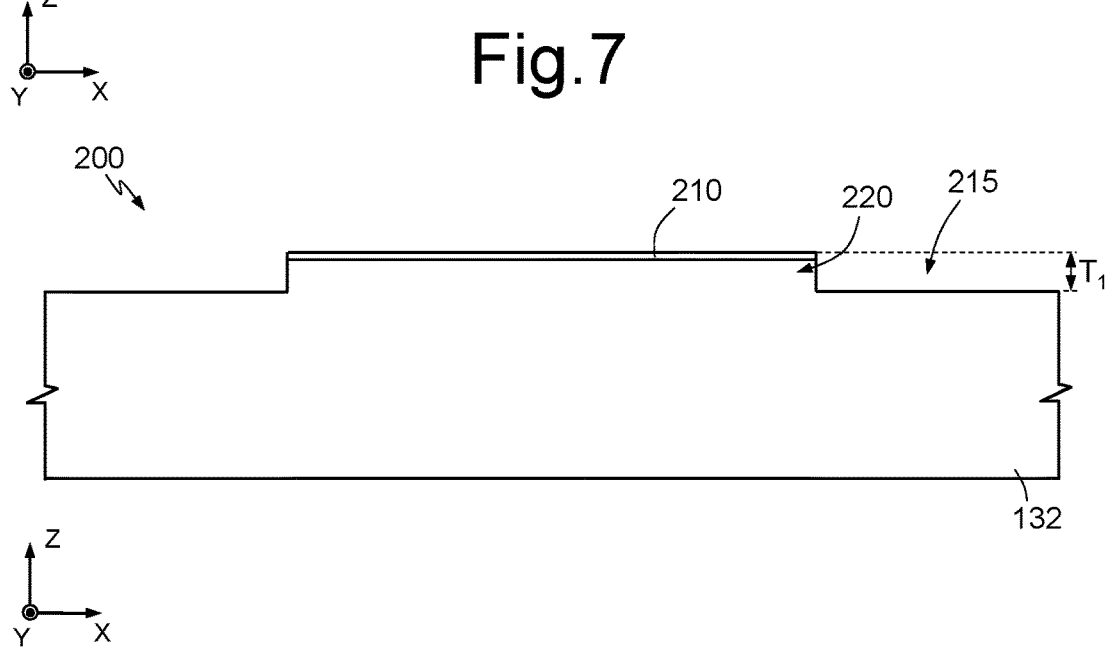

With reference to FIG. 8, selective portions of the wafer 200 are removed using known etching techniques (e.g., deep silicon etching), thus forming a side recess 215, which surrounds a projecting portion 220. In particular, the side recess 215 has, in top plan view, a circular shape of a diameter equal to the diameter $D_2$ of the opening 170A illustrated in FIGS. 5-6, is delimited at the bottom by the third surface 132A of the substrate 132, and in practice defines the dimensions of the first portion 180. The side recess 215 in the first wafer 200 moreover has a first thickness equal to $T_1$, i.e. equal to the stiffening element 170 to be formed.

Figure 9:
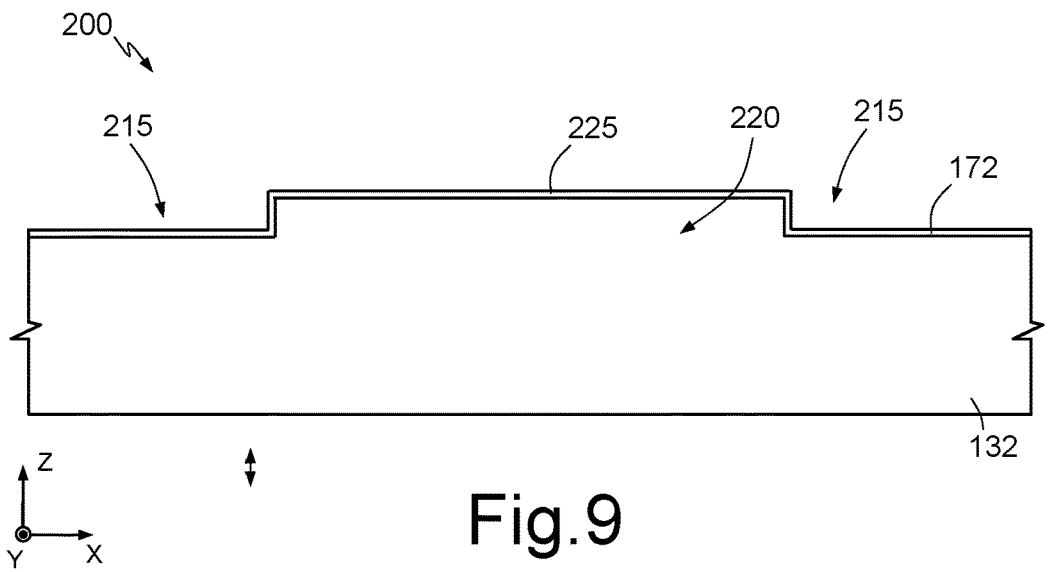

With reference to FIG. 9, a first etch-stop layer 225, for example of silicon oxide, is deposited on the surface of the wafer 200 for a thickness, for example, comprised between 0.6 μm and 1 μm; then, the first etch-stop layer 225 is subjected to thermal densification according to known techniques, thus forming (on the walls and on the bottom of the side recess 215) the coating layer 172 of the stiffening element 170. The first etch-stop layer 225 incorporates the protective layer 210 on the projecting portion 220 of the side recess 215.

Figure 10:
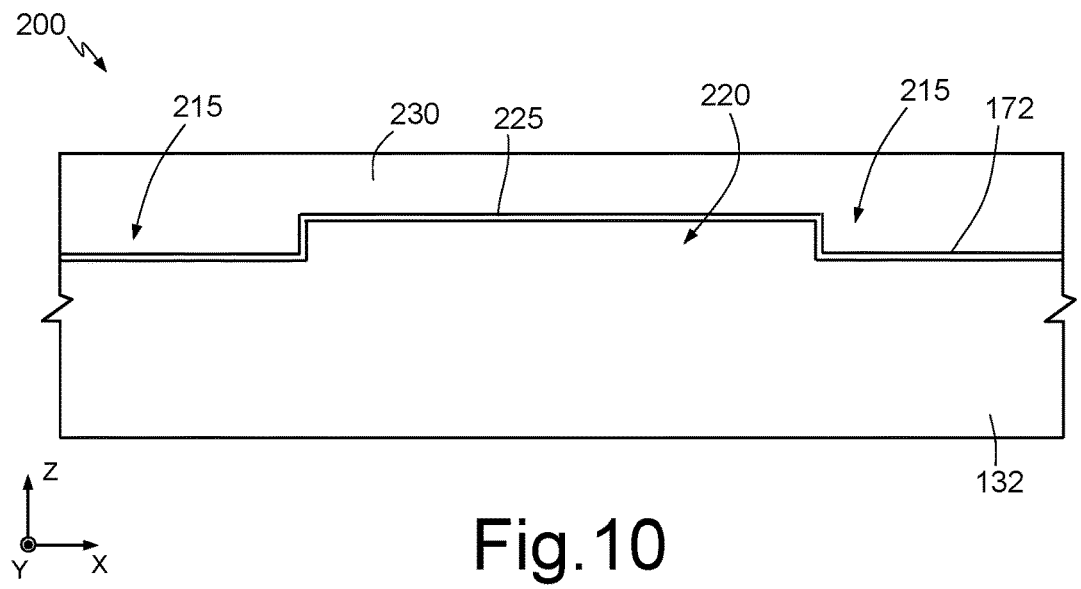

Next, FIG. 10, using known techniques, an epitaxial layer 230, filling the side recess 215, is grown on the surface of the wafer 200. The epitaxial layer 230 is grown for a thickness, in a direction parallel to the axis Z, for example, of approximately 30 μm.

Figure 11:
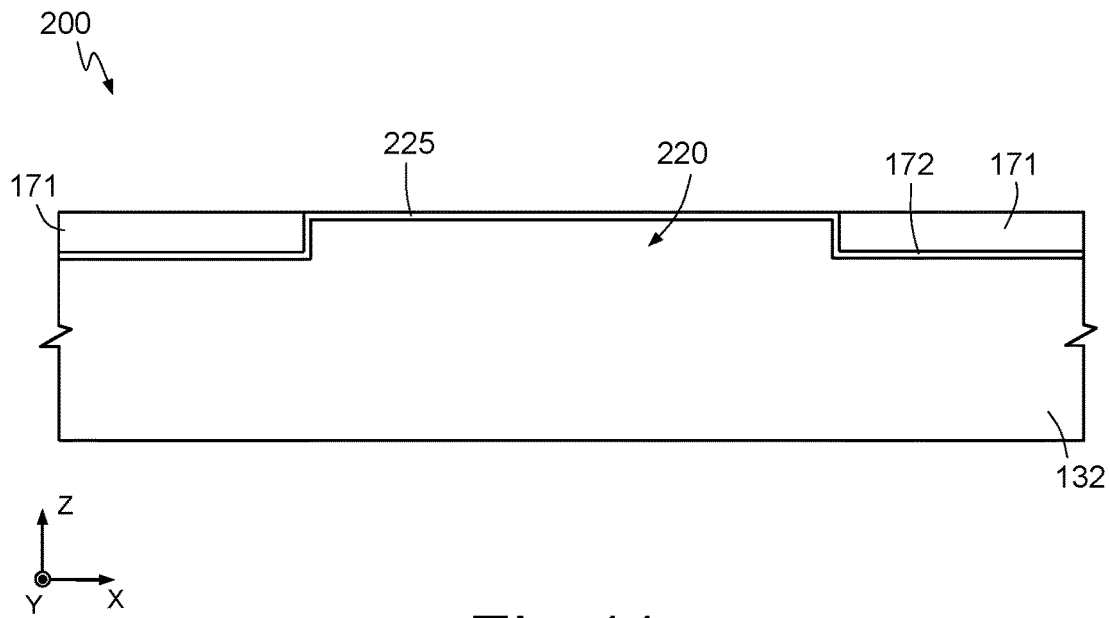

In FIG. 11, the epitaxial layer 230 is thinned out and planarized according to known techniques. In particular, the epitaxial layer 230 is reduced to a thickness greater by a few micrometers than the first thickness $T_1$ using a grinding step. Then, the surface of the epitaxial layer 230 is polished using known techniques, such as CMP (Chemical-Mechanical Polishing). In this way, the thickness of the epitaxial layer 230 is further reduced by approximately 5 μm, up to approximately 10 μm, and planarized. In the polishing step, the first etch-stop layer 225 allows the polishing operation to stop, thus functioning as a hard stop. In this way, the remaining portions of the epitaxial layer 230 form the stiffening layer 171 of the stiffening element 170.

Figure 12:
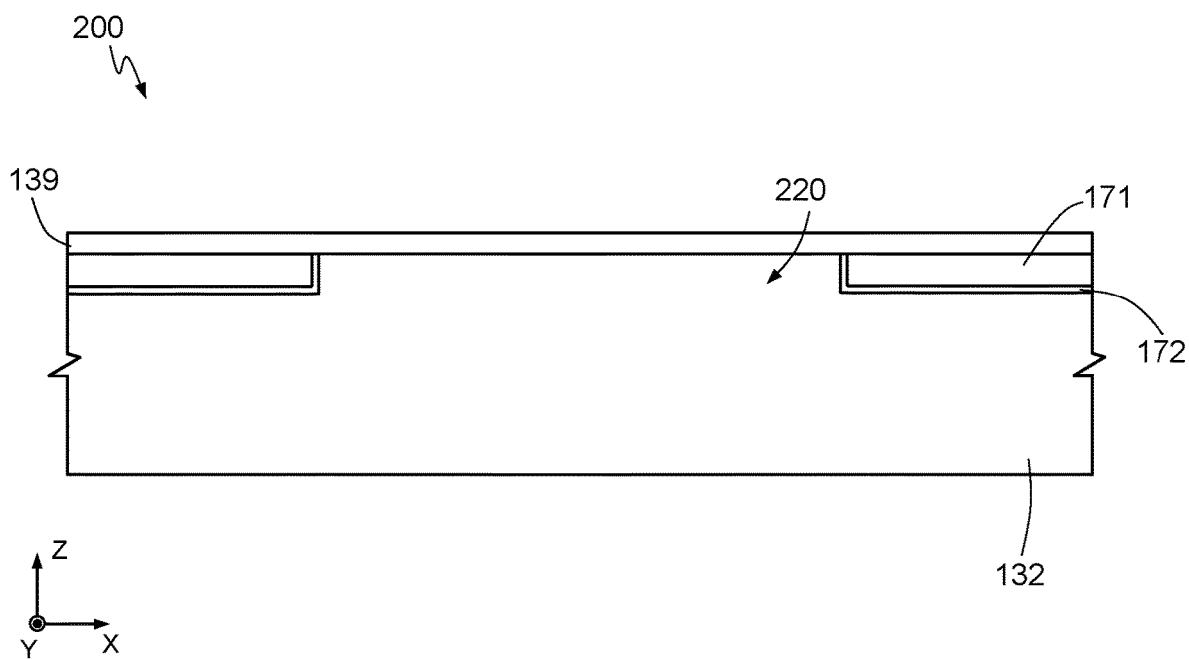

With reference to FIG. 12, a second etch-stop layer (not illustrated) is deposited on the epitaxial layer 230 thus thinned out. Next, the second etch-stop layer is subjected to densification, thus forming the insulating layer 139 that, on the projecting portion 220, incorporates the first etch-stop layer 225.

Figure 13:
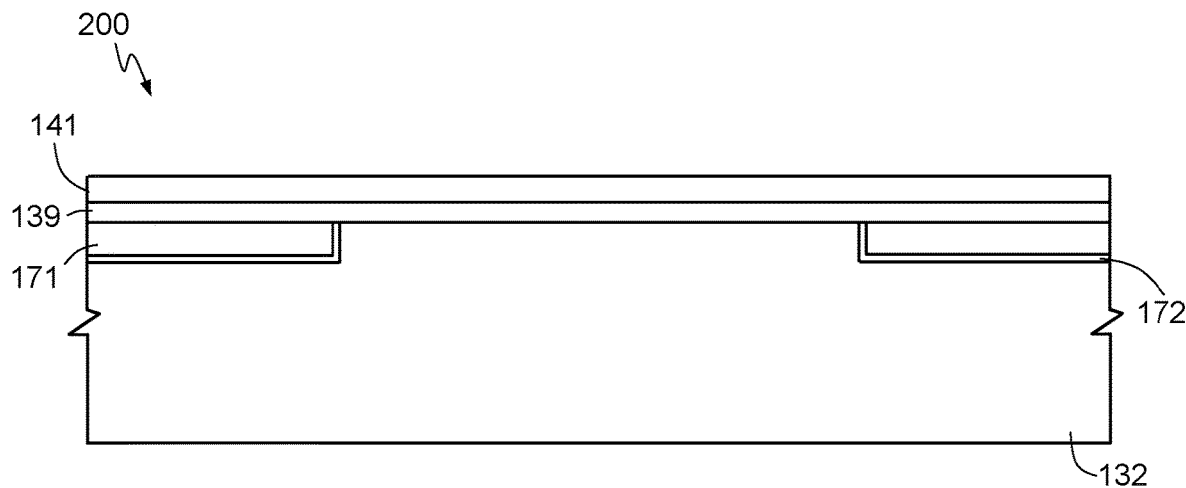

Next, FIG. 13, the structural layer 141 is grown on the surface of the insulating layer 139 for a thickness, for example, comprised between 2 μm and 30 μm in a per se known manner. Then, a dielectric layer (not illustrated) may be deposited on the structural layer 141 and subjected to densification in a per se known manner to form the insulator interposed between the structural layer 141 and the first electrode 162.

Figure 14:
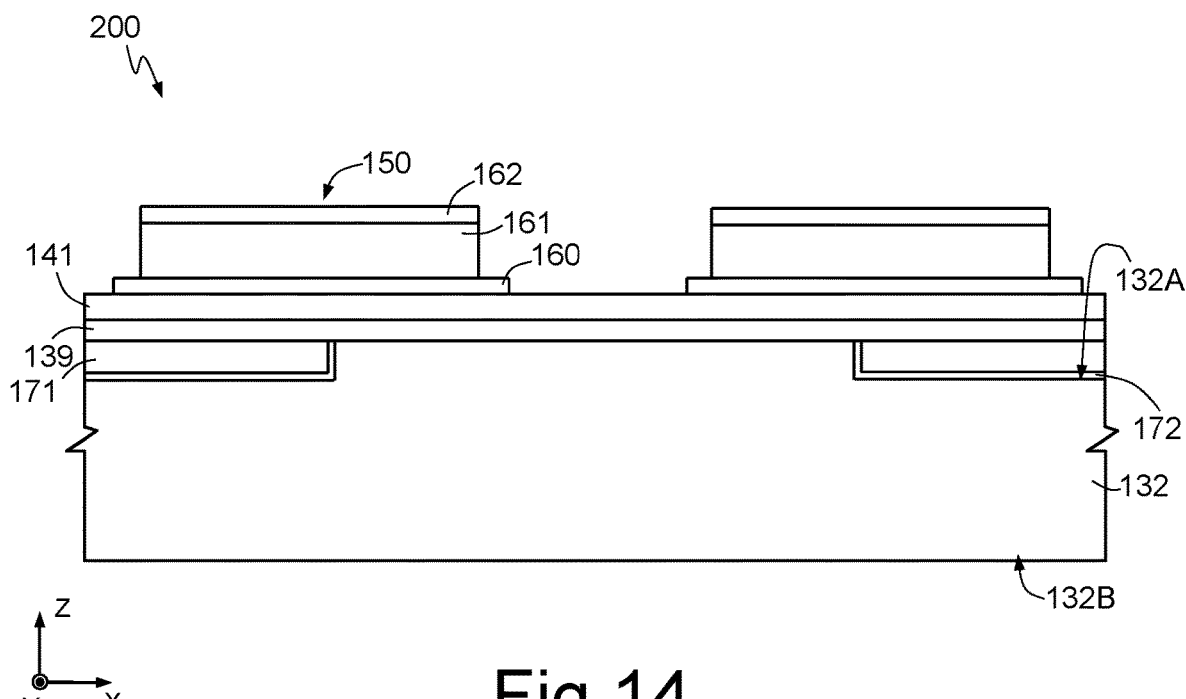

Next, FIG. 14, the first electrode 160 is formed on the structural layer 141 using known deposition and masking techniques. Then, a piezoelectric layer and an electrode layer, which are defined by known masking and definition techniques s to form the piezoelectric material layer 161 and the second electrode 162, are deposited in succession. In this way, the piezoelectric actuator 150 is formed.

Next, a mask layer (not illustrated) is deposited and patterned on the second surface 132B of the substrate 132, which is etched from the back using known photolithographic and etching techniques (e.g., through anisotropic etching, such as DRIE—Deep Reactive Ion Etching) so as to form the cavity 134 and the opening 170A, thus releasing the membrane 137.

At the end of the process, the mask layer is removed, and the wafer 200 is diced so as to obtain the MEMS device 130 of FIGS. 5-6.

Figure 8A:
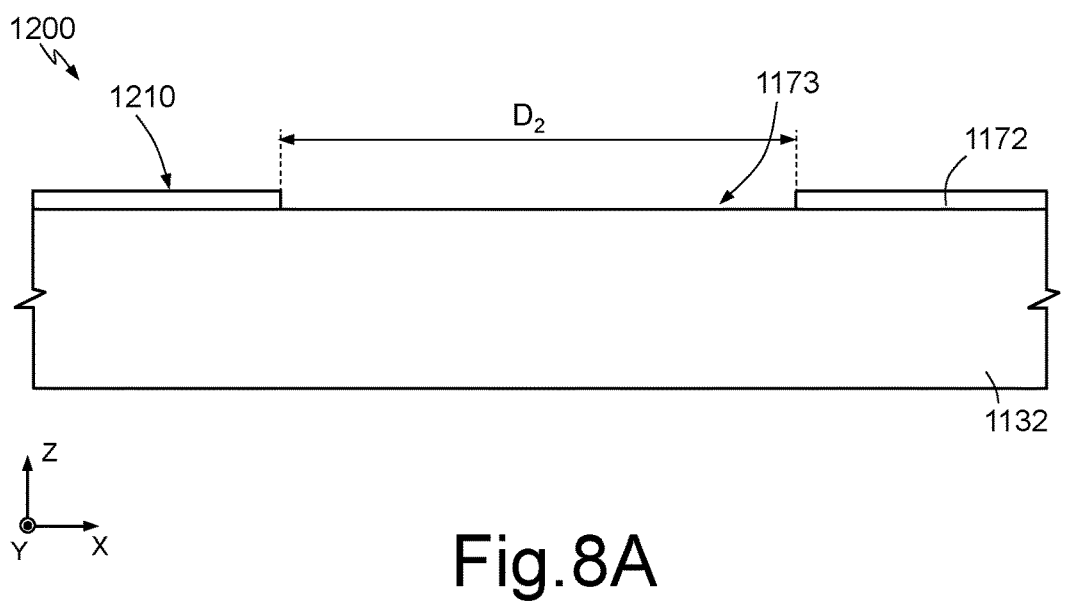
Figure 9A:
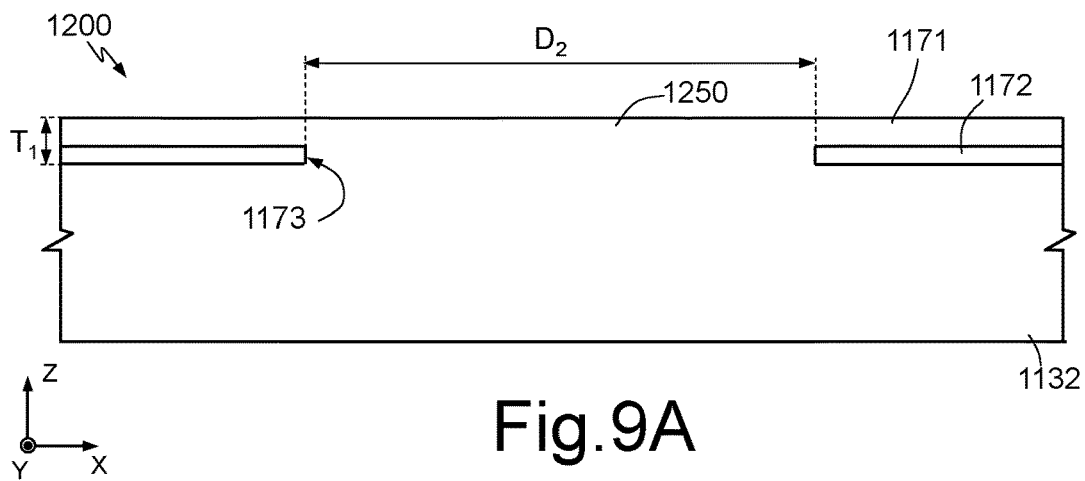

In a variant of the manufacturing process of the stiffening element 170 illustrated in FIGS. 8-11, the stiffening element 170 of the acoustic transducer 130 is formed according to the manufacturing steps illustrated in FIGS. 8A and 9A. In particular, FIGS. 8A and 9A show manufacturing steps similar to the ones illustrated in FIGS. 8-11 so that parts similar to those illustrated and described with reference to FIGS. 8-11 are designated in FIGS. 8A and 9A by the same reference numbers increased by 1000 and will not be described any further.

With reference to FIG. 8A, a portion of the protective layer 1210 is removed using known etching techniques (e.g., dry etching, wet etching, or sputter etching) so as to form part of the coating 1172, and thus an opening 1173 having a shape and area (in top plan view) corresponding to those of the opening 170A of FIG. 5.

Next, FIG. 9A, using known techniques, a further epitaxial layer 1250 intended to form the stiffening layer 1171 is grown on the surface of the wafer 1200. In particular, the further epitaxial layer 1250 is grown on the coating 1172 and fills the opening 1173. The further epitaxial layer 1250 is grown for a thickness, in a direction parallel to the Z axis, greater by a few micrometers than the first thickness $T_1$.

Next, the further epitaxial layer 1250 is planarized and polished according to known techniques, in a way similar to what described with reference to FIG. 11.

The further manufacturing steps are similar to the ones described in FIGS. 12-14. In particular, the coating 1172, formed in the step of FIG. 8A, functions as hard stop for the process of back etching described with reference to FIG. 14.

Figure 15:
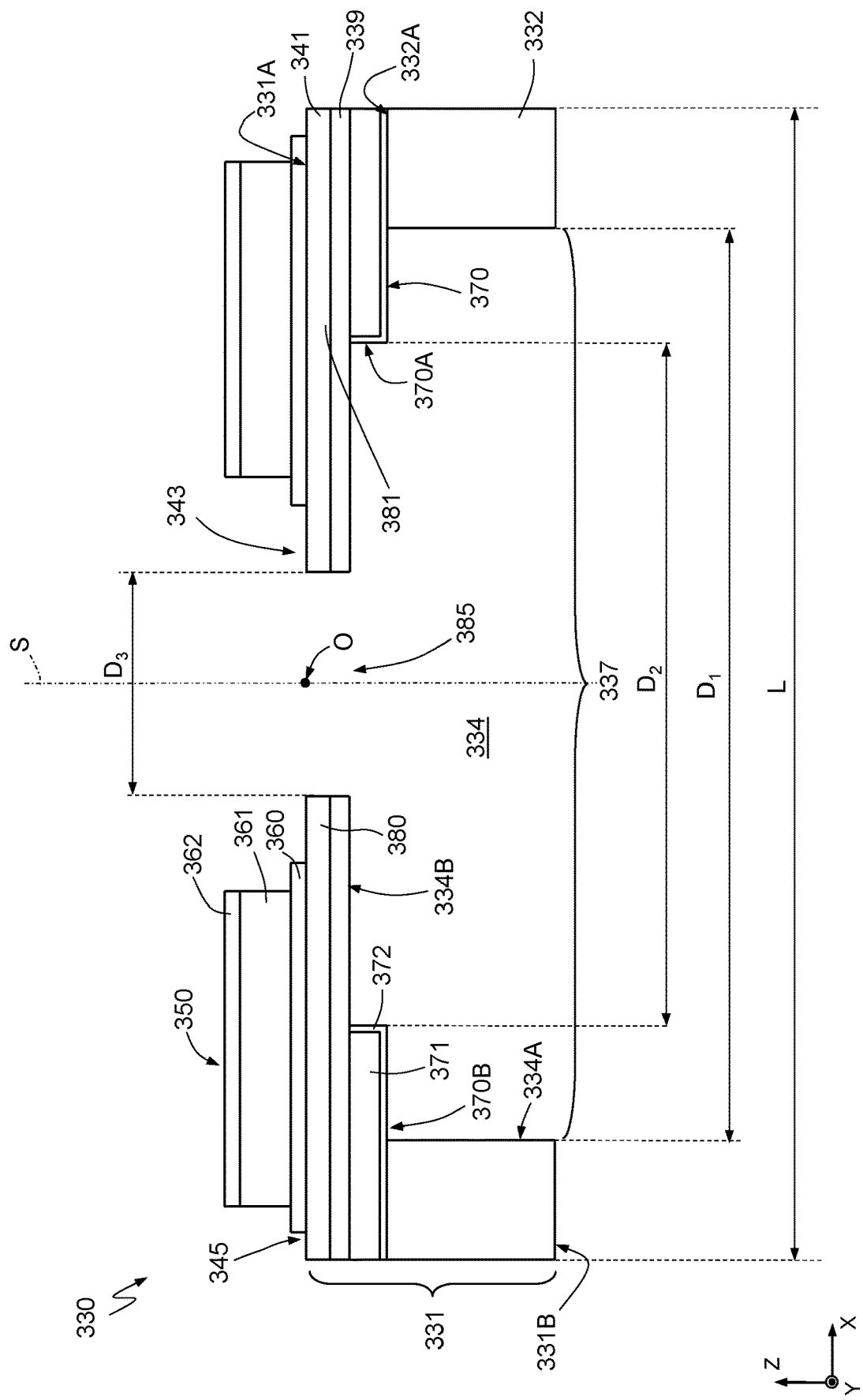
FIG. 15 shows a simplified cross-section of the present MEMS device according to another embodiment.
Figure 16:
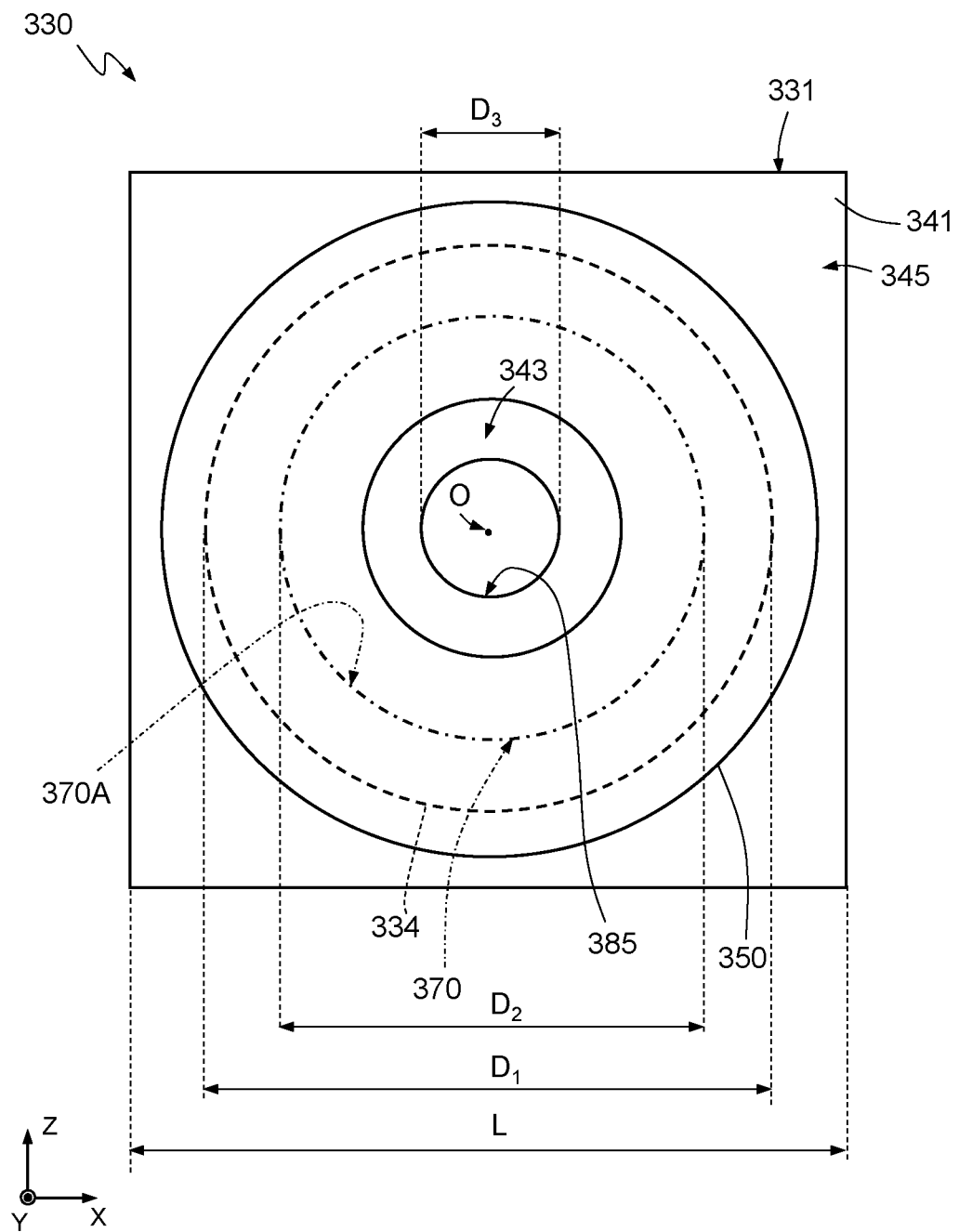
FIG. 16 shows the MEMS device of FIG. 15 in top plan view.

FIGS. 15-16 show another embodiment of the present MEMS device. In detail, FIGS. 15-16 show a MEMS device 330 having a general structure similar to the MEMS device 130 of FIGS. 5-6, so that parts similar to the ones illustrated and described with reference to FIGS. 5-6 are designated in FIGS. 15-16 by the same reference numbers increased by 200 and will not be described any further.

In particular, the MEMS device 330 has a through hole 385, extending through the structural layer 341 and the insulating layer 339 at the first portion 380 of the membrane 337. In particular, the through hole 385 has, in top plan view (FIG. 16), a circular shape, is concentric with the cavity 334 and the opening 370A, and has a diameter $D_3$. In particular, the diameter $D_3$ is smaller than the diameter $D_1$ of the cavity 334 and the diameter $D_2$ of the opening 370A.

Moreover, in the present embodiment, the structural layer 341 may, for example, be of polysilicon, silicon, BPSG or metal (such as copper, Cu, aluminum, Al, platinum, Pt, gold, Au).

Figure 4:
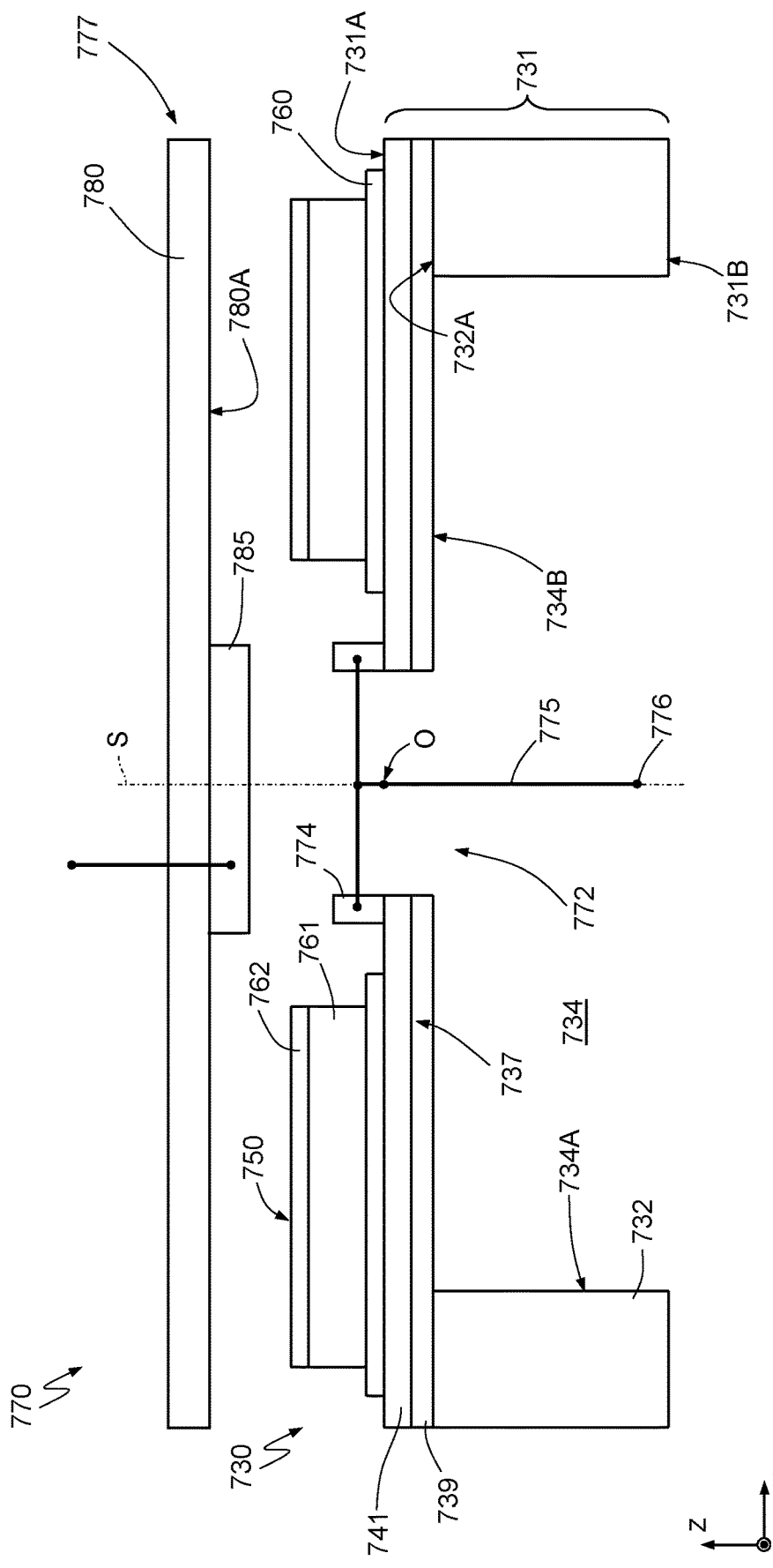
FIG. 4 shows a cross-section of a radiofrequency switch including a known MEMS actuator.

An electrical contact (not illustrated) similar to the electrical contact 774 of FIG. 4) may be provided on the first portion 380 of the membrane 337.

The MEMS device 330 may advantageously be used, for example, for acoustic applications (e.g., such as microphone), as a valve, or as an RF switch in a way similar to what discussed for the switch 770 of FIG. 4.

The MEMS device 330 of FIGS. 15-16 is manufactured with a manufacturing process similar to the one described with reference to FIGS. 7-14. In particular, the through hole 385 is obtained by known photolithographic and etching techniques (e.g., Si dry etching, laser ablation, or cutting techniques such as sand-and-water cutting) at the end of the step described with reference to FIG. 14.

Figure 17:
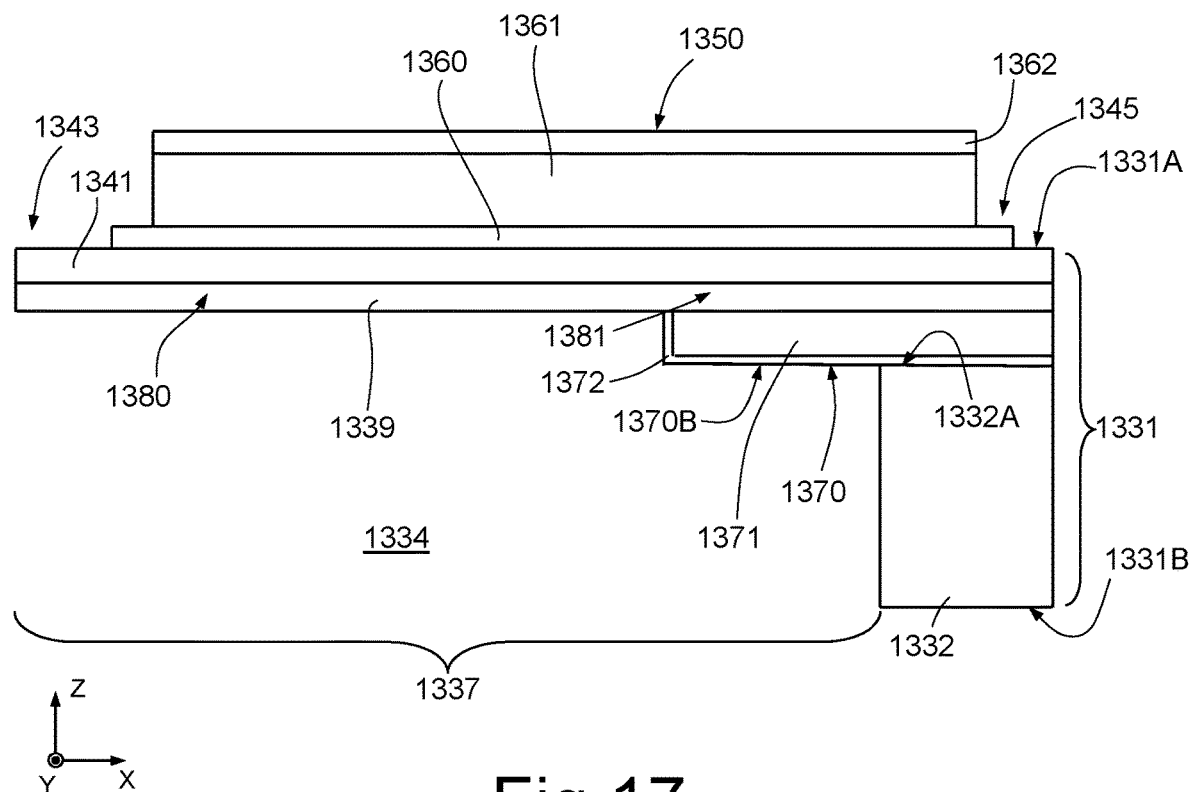
FIG. 17 shows a simplified cross-section of the present MEMS device according to a further embodiment.

FIG. 17 shows another embodiment of the present MEMS device. In detail, FIG. 17 shows a MEMS device 1330 having a general structure similar to the MEMS device 330 of FIGS. 15-16, so that parts that are similar to the ones illustrated and described with reference to FIGS. 15-16 are designated in FIG. 17 by the same reference numbers increased by 1000, and will not be described any further.

In particular, the membrane 1337 forms a cantilever, suspended over the cavity 1334. Moreover, in the present embodiment, the membrane 1337 has, for example, a quadrangular (e.g., rectangular) shape in top plan view (not illustrated); in addition, the piezoelectric actuator 1350 has, for example, a quadrangular (e.g., rectangular) shape in top plan view (not illustrated).

In use, the MEMS device 1330 operates according to the operating modalities described with reference to the MEMS devices 130, 330 of FIGS. 5-6 and 15-16.

Moreover, the MEMS device 1330 is obtained in a way similar to what described with reference to the manufacturing steps illustrated in FIGS. 7-14.

Figure 18:
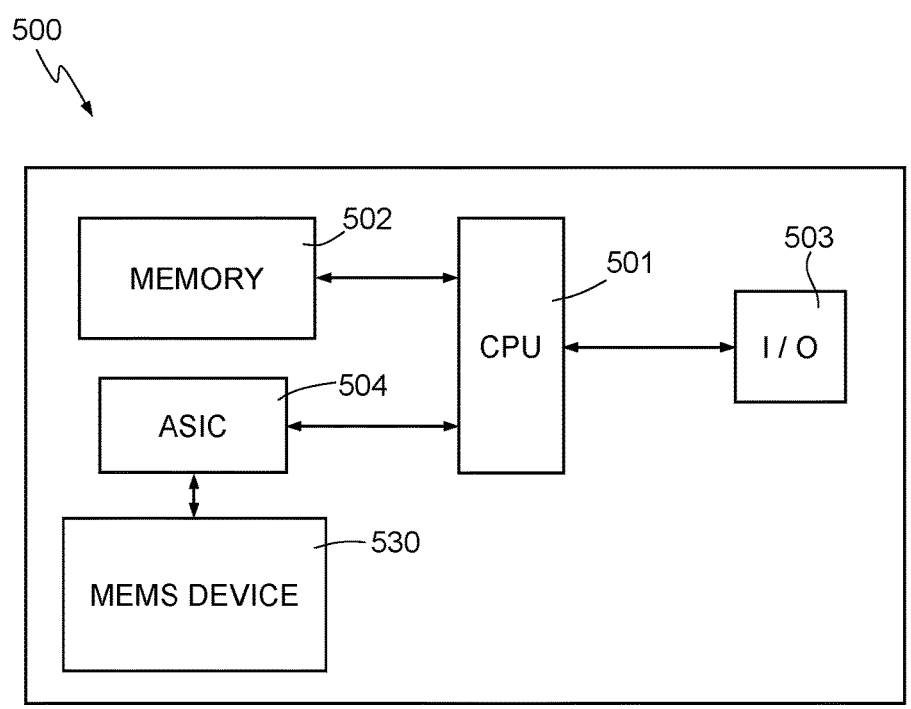
FIG. 18 shows a block diagram of an electronic apparatus including the MEMS device of FIGS. 5-6 and 15-16.

FIG. 18 shows an electronic device 500 that uses the MEMS device 130, 330 according to one of the embodiments illustrated in FIGS. 5-6 and 15-16, respectively. In particular, hereinafter the MEMS device 130, 330 is designated as a whole in FIG. 18 by the reference number 530.

The electronic device 500 comprises, in addition to the MEMS device 530, a microprocessor (CPU) 501, a memory block 502, connected to the microprocessor 501, and an input/output interface 503, for example a keyboard and/or a display, also connected to the microprocessor 501. An application-specific integrated circuit (ASIC) 504 may be integrated in the MEMS device 530 or, as illustrated in FIG. 17, may be arranged outside the MEMS device 530 and operatively coupled thereto.

The MEMS device 530 communicates with the microprocessor 701 via the ASIC 504.

The electronic device 500 is, for example, a mobile communication device, such as a mobile phone or smartphone, a PDA, or a computer, but may also be a voice recorder, a player of audio files with voice-recording capacity, a console for video games, and the like.

The present MEMS device and the manufacturing process thereof have various advantages.

In particular, the presence of the stiffening element 170, 370 allows to reduce the impact of mechanical shock, for instance when the MEMS device 30, 330 is dropped. In particular, the stiffening element 170, 370 is arranged in the second portion 181, 381 of the membrane 137, 337, where there is a high stress in the case of a high force. In addition, the stiffening element 170, 370 is of a material capable of withstanding high tensile stresses (e.g., polysilicon). In this way, in the presence of mechanical shocks, the deflection of the membrane 137, 337 of the MEMS device 30, 330 is limited in so far as the stiffening element 170, 370 (and thus the second portion 181, 381 of the membrane 137, 337) is able to absorb at least in part the force (and, thus, the stress) and consequently reduce the risk of failure or weakening of the membrane due to mechanical shock.

Moreover, the present MEMS device 130, 330 is manufactured according to a simple and far from costly manufacturing process.

Finally, it is clear that modifications and variations may be made to the MEMS device and to the manufacturing process described and illustrated herein, without thereby departing from the scope of the present disclosure, as defined in the attached claims.

For instance, the stiffening element 170, 370, 1370 may be provided in MEMS devices of the type described in U.S. Patent Publication No. 2018/0190895, which describes a piezoelectric micro-actuator formed by a beam element of semiconductor material and by a piezoelectric region, extending over the beam. In particular, one end of the beam element is fixed and may be provided with the stiffening element 180, 380, 1380; the other end is connected to a hinge element of a constraint structure that is not deformable in the thickness direction of the beam.

Moreover, the present stiffening element 170, 370, 1370 may be provided in MEMS devices of the type described in U.S. Patent Publication No. US2019/0240844, which describes a MEMS device of a piezoelectric type having a first and a second manipulation arm formed by a control arm and an articulated arm. The control arm of both of the manipulation arms may be provided with the stiffening element described herein.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a piezoelectric actuator on a first surface of a body of semiconductor material further having a second surface, a first portion, and a second portion; and
   removing selective portions of the body from the second surface of the body to form a cavity extending in the body, and to form a deformable portion at the first portion of the body, the deformable portion including a first region having a first thickness in a thickness direction and a second region having a second thickness, greater than the first thickness, in the thickness direction, the second region being adjacent to the first region of the deformable portion and being adjacent to the first portion of the body, and
   wherein forming the piezoelectric actuator includes patterning a stack of layers into an annular shape, the piezoelectric actuator exposing the second portion of the body.

2. The method according to claim 1, comprising, prior to forming the piezoelectric actuator, forming the body by forming a stiffening element and a structural layer on a substrate of semiconductor material, and wherein removing selective portions of the body comprises removing portions of the substrate to form the cavity and a through opening in the stiffening element, the through opening and the cavity being mutually aligned and contiguous and having respective areas in in respective planes transverse to the thickness direction, the area of the through opening being smaller than the area of the cavity.

3. The method according to claim 2, wherein forming the stiffening element comprises:
removing selective portions of the substrate to form a recess and a projecting portion defined by the recess;
forming an etch-stop layer on side surfaces of the projecting portion and in the recess; and
forming a stiffening layer in the recess and at sides of the projecting portion.

4. The method according to claim 3, wherein forming the stiffening layer comprises growing an epitaxial layer and thinning the epitaxial layer as far as the projecting portion.

5. The method according to claim 3, further comprising:
forming an insulating layer on the projecting portion and on the stiffening element; and
forming the structural layer on the insulating layer.

6. The method according to claim 2, wherein forming the stiffening element comprises:
forming a etch-stop layer on a surface of the substrate;
removing a portion of the etch-stop layer to form a coating layer that delimits an opening; and
forming a stiffening layer on the coating layer.

7. The method according to claim 6, wherein forming the stiffening layer comprises growing an epitaxial layer on the coating layer and on the substrate, the epitaxial layer filling the opening of the coating layer.

8. The method according to claim 2, wherein the through opening is surrounded by the annular shape of the piezoelectric actuator.

9. A method, comprising:
forming a protective layer on a first surface of a substrate;
forming a side recess and forming a projecting portion at the surface of the substrate surrounded by the side recess by removing selective portions of the substrate and the protective layer;
forming an etch stop layer including a portion of the protective layer by forming an etch stop material along a sidewall of the projecting portion and in the side recess;
forming an epitaxial layer on the etch stop layer, in the side recess, and overlapping the projecting portion;
removing a portion of the epitaxial layer exposing a portion of the etch stop layer on the projecting portion;
forming a plurality of layers on a portion of the epitaxial layer in the side recess and on the surface of the projecting portion;
forming a piezoelectric actuator on the plurality of layers; and
forming a cavity extending into a second surface of the substrate opposite to the first surface of the substrate and extending to the plurality of layers.

10. The method of claim 9, wherein forming the plurality of layers includes:
forming an insulating layer on the epitaxial layer in the side recess and on the surface of the projecting portion; and
forming a structural layer on the insulating layer.

11. The method of claim 10, wherein forming the piezoelectric actuator on the plurality of layers includes forming the piezoelectric actuator on the structural layer.

12. The method of claim 9, wherein forming the cavity includes:
removing the projecting portion; and
removing a portion of the substrate overlapped by the projecting portion and overlapped by the etch stop layer.

13. The method of claim 12, wherein removing the portion of the substrate overlapped by the projecting portion and overlapped by the etch stop layer further includes forming a sidewall of the substrate that delimits that cavity.

14. The method of claim 12, wherein removing the projecting portion and removing the portion of the substrate overlapped by the projecting portion and overlapped by the etch stop layer exposes the etch stop layer.

15. The method of claim 12, further comprising forming a through hole extending through the plurality of layers to the cavity.

16. The method of claim 10, wherein forming the insulating layer further includes forming the insulating layer to include the portion of the etch stop layer.

17. A method, comprising:
forming a protective layer on a first surface of a substrate;
exposing a region of the first surface of the substrate by forming an opening through the protective layer;
forming an epitaxial layer on the region of the first surface of the substrate, in the opening, and on the protective layer;
forming a plurality of layers on a surface of the epitaxial layer;
forming a piezoelectric actuator on the plurality of layers; and
forming a cavity extending into a second surface of the substrate opposite to the first surface of the substrate and extending to the plurality of layers.

18. The method of claim 17, wherein forming the plurality of layers includes:
forming an insulating layer on the epitaxial layer; and
forming a structural layer on the insulating layer.

19. The method of claim 18, wherein forming the piezoelectric actuator on the plurality of layers further includes forming the piezoelectric actuator on the structural layer.

20. The method of claim 17, wherein forming the cavity further includes:
forming a sidewall of the substrate that delimits the cavity; and
exposing a surface of the protective layer that delimits the cavity.

* * * * *

UNITED STATES PATENT AND TRADEMARK OFFICE
CERTIFICATE OF CORRECTION

PATENT NO. : 12,185,633 B2  
APPLICATION NO. : 18/329975  
DATED : December 31, 2024  
INVENTOR(S) : Domenico Giusti et al.

Page 1 of 1

It is certified that error appears in the above-identified patent and that said Letters Patent is hereby corrected as shown below:

In the Claims

Column 10, Claim 2, Line 65:
"areas in in respective planes" should read: --areas in respective planes--.

Signed and Sealed this
Fourth Day of March, 2025

Coke Morgan Stewart
*Acting Director of the United States Patent and Trademark Office*